(12) United States Patent
Gunzner et al.

(10) Patent No.: US 11,646,702 B2
(45) Date of Patent: *May 9, 2023

(54) METHODS AND APPARATUSES FOR REFLECTION MEASUREMENTS

(71) Applicant: Andrew Wireless Systems GmbH, Buchdorf (DE)

(72) Inventors: Peter Gunzner, Monheim (DE); Johannes Steigert, Harburg (DE); Felix Lübbers, Augsburg (DE); Peter Schmid, Marxheim-Neuhausen (DE); Patrick Braun, Munningen (DE)

(73) Assignee: Andrew Wireless Systems GmbH, Buchdorf (DE)

(*) Notice: Subject to any disclaimer, the term of this patent is extended or adjusted under 35 U.S.C. 154(b) by 41 days.

This patent is subject to a terminal disclaimer.

(21) Appl. No.: 17/350,772

(22) Filed: Jun. 17, 2021

(65) Prior Publication Data

US 2021/0313934 A1   Oct. 7, 2021

Related U.S. Application Data

(63) Continuation of application No. 16/559,157, filed on Sep. 3, 2019, now Pat. No. 11,082,015.

(51) Int. Cl.
*H03F 1/56* (2006.01)
*G01R 27/06* (2006.01)
(Continued)

(52) U.S. Cl.
CPC .............. *H03F 1/56* (2013.01); *G01R 27/06* (2013.01); *G01R 27/28* (2013.01); *H01P 5/18* (2013.01);
(Continued)

(58) Field of Classification Search
CPC ........... H03F 1/56; G01R 27/06; G01R 27/28; H02H 1/0007; H02H 9/00
See application file for complete search history.

(56) References Cited

U.S. PATENT DOCUMENTS 5,196,808 A   3/1993   Pickett et al.
5,959,533 A   9/1999   Layson, Jr. et al.
(Continued)

FOREIGN PATENT DOCUMENTS

WO   2013140275 A1   9/2013
WO   2018041643 A1   3/2018

OTHER PUBLICATIONS

"Measurement Errors", at least as early as Sep. 27, 2018, pp. 1-9, http://na.support.keysight.com/vna/help/latest/S3_Cals/Errors.htm.
(Continued)

*Primary Examiner* — Scott Bauer
(74) *Attorney, Agent, or Firm* — Fogg & Powers LLC

(57) ABSTRACT

Techniques are provided to more accurately determine reflected power, reflection coefficient, and/or voltage standing wave to permit prompt protection of components such as power amplifiers and notify communication system operators. This is accomplished by more accurately determining an amplitude and phase of an output reflected signal at an output port of a bidirectional coupler as a function of the following: an amplitude and a phase of a coupled forward signal coupled into a forward coupled port of the bidirectional coupler; an amplitude and a phase of a coupled reverse signal coupled into a reverse coupled port of the bidirectional coupler; an electrical transmission parameter from an input port of the bidirectional coupler to the forward coupled port; an electrical transmission parameter from the input port
(Continued)

to the reverse coupled port; and an electrical transmission parameter from an output port of the bidirectional coupler to the reverse coupled port.

27 Claims, 7 Drawing Sheets

Related U.S. Application Data

(60) Provisional application No. 62/755,951, filed on Nov. 5, 2018.

(51) Int. Cl.
    *G01R 27/28*     (2006.01)
    *H01P 5/18*     (2006.01)
    *H02H 1/00*     (2006.01)
    *H02H 9/00*     (2006.01)
    *H03F 3/21*     (2006.01)
    *H03M 1/12*     (2006.01)
    *H04B 1/04*     (2006.01)

(52) U.S. Cl.
    CPC ............ *H02H 1/0007* (2013.01); *H02H 9/00* (2013.01); *H03F 3/21* (2013.01); *H03F 2200/451* (2013.01); *H03M 1/12* (2013.01); *H04B 1/04* (2013.01)

(56) References Cited

U.S. PATENT DOCUMENTS

| | | | |
|---|---|---|---|
| 6,329,880 B2 | 12/2001 | Akiya | |
| 8,260,219 B2 | 9/2012 | Tseng et al. | |
| 9,594,147 B2 | 3/2017 | Han et al. | |
| 10,361,473 B2 | 7/2019 | Okabe | |
| 10,381,878 B1* | 8/2019 | Grundmann | H01R 27/02 |
| 2002/0113600 A1 | 8/2002 | Swank, II | |
| 2009/0243628 A1* | 10/2009 | Andarawis | H03D 13/00 |
| | | | 324/76.77 |
| 2010/0019983 A1 | 1/2010 | Bonnet et al. | |
| 2011/0227585 A1 | 9/2011 | Andarawis | |
| 2013/0257667 A1 | 10/2013 | Kang | |
| 2015/0293304 A1 | 10/2015 | Borodulin | |
| 2016/0269072 A1 | 9/2016 | Obiya et al. | |
| 2017/0352947 A1* | 12/2017 | Solomko | H01Q 1/241 |
| 2018/0159222 A1* | 6/2018 | Backes | H03H 7/40 |
| 2020/0144973 A1 | 5/2020 | Gunzner et al. | |
| 2020/0169235 A1* | 5/2020 | Valk | H03F 3/189 |

OTHER PUBLICATIONS

Agilent, "Exploring the Architectures of Network Analyzers Application Note", Agilent AN 1287-2, at least as early as 2000, pp. 1-11, Agilent Technologies.

Carbonini et al., "A Procedure to Evaluate The Output VSWR of High Power Amplifiers", 1998, pp. 241-244, IEEE.

International Searching Authority, "International Search Report and Written Opinion from PCT Application No. PCT/EP2019/080142", from Foreign Counterpart to U.S. Appl. No. 16/559,157, filed Jan. 28, 2020, pp. 1 through 17, Published: WO.

U.S. Patent and Trademark Office, "Notice of Allowance", U.S. Appl. No. 16/559,157, filed Mar. 26, 2021, pp. 1 through 19, Published: US.

Wang et al. "Real Time Measurement of VSWR with Directional Couplers", 4th International Conference on Microwave and Millimeter Wave Technology Proceedings, 2004, pp. 719-722, IEEE.

\* cited by examiner

METHODS AND APPARATUSES FOR REFLECTION MEASUREMENTS

CROSS-REFERENCE TO RELATED APPLICATIONS

The present application is a continuation of U.S. patent application Ser. No. 16/559,157, filed Sep. 3, 2019, which claims benefit of U.S. Patent Application Ser. No. 62/755,951, filed Nov. 5, 2018; the entire contents of the aforementioned patent application are incorporated herein by reference as if set forth in its entirety.

BACKGROUND

Transmitters are used in communications systems such as base stations and distributed antenna systems. Transmitters typically employ power amplifiers to boost the power of a transmitted signal.

In the event of an impedance mismatch between an output of the power amplifier and its load (e.g. subsequent components such as a diplexer, duplexer, or antenna), reflected energy may damage the power amplifier. Impedance match can be characterized by a reflection coefficient or a voltage standing wave ratio (VSWR).

To protect the power amplifier, it is desirable to monitor reflected power, the reflection coefficient, and/or the VSWR. Output reflected power is the power level of the output reflected signal $a_2$. Coupled reverse power means the power level of the coupled reverse signal $b_4$. If the reflected power is too large, the power amplifier and other components, e.g. duplexers, can be protected by attenuating the output power of the power amplifier. Further, little or no power may be coupled to the subsequent components.

To protect the power amplifier and other components, it is desirable to monitor reflected power, the reflection coefficient, and/or the VSWR. If the reflected power is too large, the power amplifier can be protected by attenuating the output power of the power amplifier.

Reflected power may be monitored with a directional coupler. A port of the directional coupler extracts a portion of energy reflected by the load.

However, the accuracy of the monitored reflected power is limited by the finite directivity of a directional coupler. Directivity is a figure of merit of a coupler that defines how well a coupled port discriminates between signals propagating in opposite directions. For example, a reverse coupled port is intended to measure energy reflected into an output port, of the directional coupler by a load coupled to that output port. The coupler's finite directivity arises because a portion of the energy emitted by the power amplifier into the input port of the directional coupler is also undesirably coupled to the reverse coupled port. Thus, the power measured at the reverse coupled port does not express solely the energy reflected by the load but also a portion of the power emitted by the power amplifier. The power measured at the reverse coupled port is therefore an inaccurate measurement of the energy reflected into the output port. This inaccuracy can detrimentally affect a system's ability to transmit enough energy and to protect the power amplifier and other components from high levels of reflected energy and/or to vary the power output of the power amplifier to ensure that the power amplifier provides linear amplification.

SUMMARY

A method is provided. The method comprises: measuring amplitude and phase of a coupled forward signal at a forward coupled port of a bidirectional coupler; measuring an amplitude and a phase of a coupled reverse signal at a reverse coupled port of the bidirectional coupler; and determining an amplitude and a phase of an output reflected signal at the output port as a function of the following: the amplitude and the phase of the coupled forward signal coupled into the forward coupled port; the amplitude and the phase of the coupled reverse signal coupled into the reverse coupled port; an electrical transmission parameter from an input port of the bidirectional coupler to the forward coupled port; an electrical transmission parameter from the input port to the reverse coupled port; and an electrical transmission parameter from an output port of the bidirectional coupler to the reverse coupled port.

DRAWINGS

Understanding that the drawings depict only exemplary embodiments and are not therefore to be considered limiting in scope, the exemplary embodiments will be described with additional specificity and detail using the accompanying drawings, in which.

DETAILED DESCRIPTION

Figure 1A:
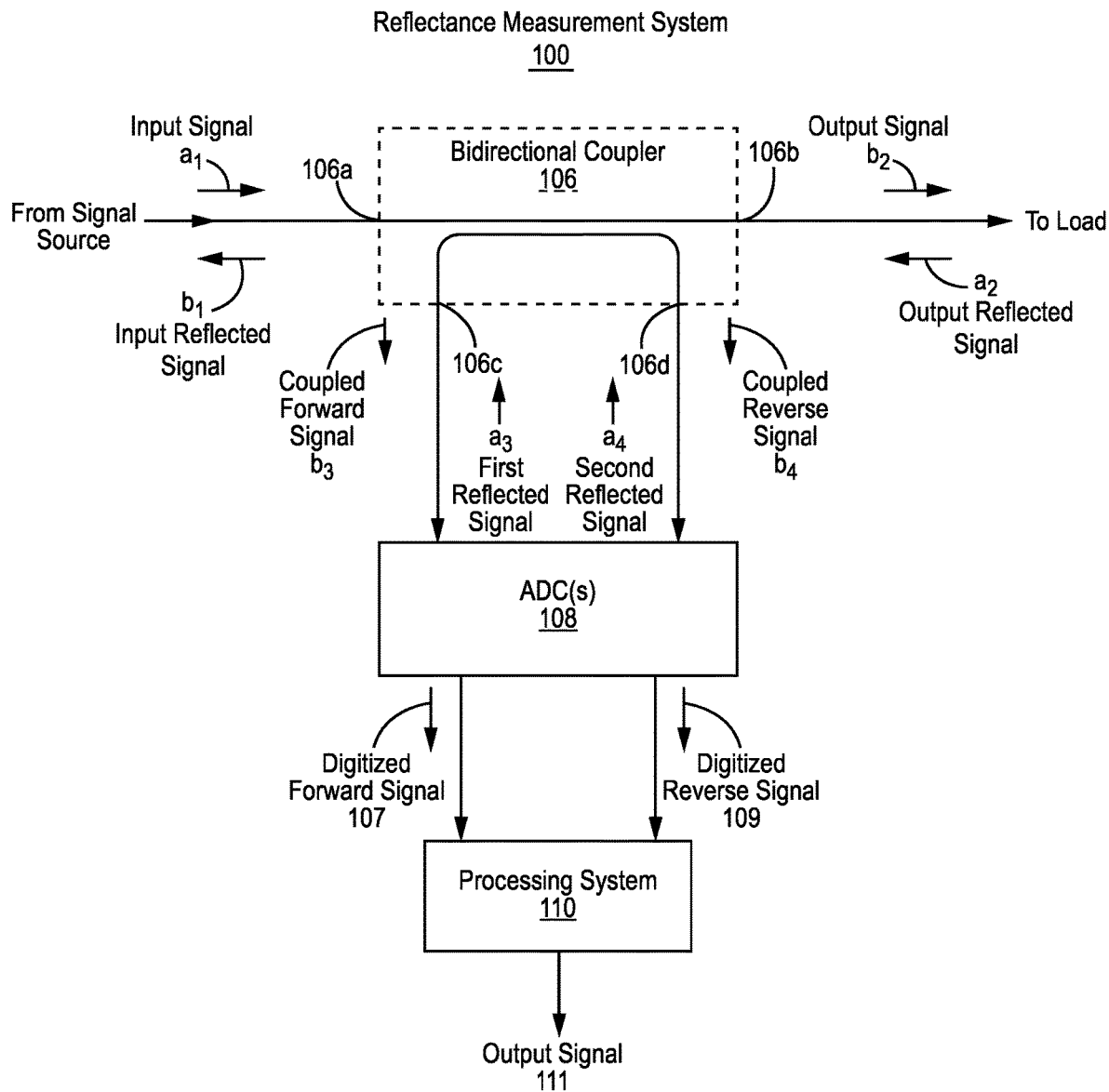
FIG. 1A illustrates a block diagram of one embodiment of a measurement system with enhanced reflection measurement.

In the following detailed description, reference is made to the accompanying drawings that form a part hereof, and in which is shown by way of illustration specific illustrative embodiments. However, it is to be understood that other embodiments may be utilized, and that structural, mechanical, and electrical changes may be made. Furthermore, the method presented in the drawing figures and the specification is not to be construed as limiting the order in which the individual steps may be performed. The following detailed description is, therefore, not to be taken in a limiting sense.

The embodiments described below use electrical parameters, e.g. S-parameters, characterizing a four port directional coupler, to more accurately determine power reflected by a load. The electrical parameters may be S-parameters or any other electrical parameters. The electrical parameters may be determined by measurement, e.g. with a vector network analyzer, or may be provided by the manufacturer of the four port directional coupler. Optionally, the four port directional coupler may be formed by two back to back three port directional couplers. The four port directional coupler is also referred to herein as a bidirectional coupler.

Some of the embodiments described below enable a power amplifier to be better protected and/or a power output of the power amplifier to be more accurately controlled based upon more accurately determined reflected power, reflection coefficient, and/or VSWR. Furthermore, because the measurements are more accurate, transmitter malfunctions can be more quickly identified and remedied. Transmitters may be used in many different types of systems including communications systems such as broadcast transmitters for radio and television, cellular base stations, distributed antenna systems, and off-air repeaters.

FIG. 1A illustrates a block diagram of one embodiment of a measurement system with enhanced reflection measurement 100 (also referred to herein as reflectance measurement system 100). The reflectance measurement system 100 comprises a bidirectional coupler 106, at least one analog to digital converter circuit (ADC(s)) 108, and a processing system (or processing system circuitry) 110.

The bidirectional coupler 106 has an input port 106a, an output port 106b, a forward coupled port 106c, and a reverse coupled port 106d. There is an input signal $a_1$ provided to the input port 106a from a signal source and an input reflected signal $b_1$ reflected from the input port 106a of the bidirectional coupler 106. At the output port 106b, there is an output reflected signal $a_2$ reflected from the load to the output port 106b of the bidirectional coupler 106 and an output signal $b_2$ provided to the load from the output port 106b of the bidirectional coupler 106. At the forward coupled port 106c, there is coupled forward signal $b_3$ coupled from the input signal $a_1$ and a first reflected signal $a_3$ reflected from, e.g. a first input of the ADC(s) 108, to the forward coupled port 106c. At the reverse coupled port 106d, there is a coupled reverse signal $b_4$ coupled from the output reflected signal $a_2$ and a second reflected signal $a_4$ reflected from, e.g. a second input of the ADC(s) 108, to the reverse coupled port 106d. Optionally, the ADC(s) 108 may comprise two analog to digital converter circuits (ADCs) each having a unique input, where an input of a first ADC is coupled to the forward coupled port 106c and where an input of the second ADC is coupled to the reverse coupled port 106d. Alternatively, a single ADC may be used with multiplexers at the input and optionally at the output of the single ADC; the multiplexer(s) couple the forward coupled port 106c and the reverse coupled port 106d to the input of the ADC, and the optional second multiplexer couples the output of the ADC to different inputs of the processing system 110. However, the processing system 110 may only have a single input coupled to the output of the ADC.

The bidirectional coupler 106 is configured to receive input signal $a_1$ from a signal source such as a power amplifier, transmitter, or any other type of signal source. The bidirectional coupler 106 is configured to provide output signal $b_2$ to a load such as an antenna, duplexer, diplexer, or any other type of load.

The bidirectional coupler 106 couples a portion of the input signal $a_1$ incident at its input port 106a ("forward signal") to a forward coupled port 106c. The amplitude and phase of the coupled forward signal $b_3$ provided at the forward coupled port 106c can be determined using a first forward coupling factor between the input port 106a and the forward coupled port 106c. The bidirectional coupler 106 couples a phase shifted portion of the output reflected signal $a_2$ incident upon the output port 106b ("reverse signal" or "reflected signal"), e.g. reflected from the load, to the reverse coupled port 106d. The amplitude and phase of the coupled reverse signal $b_4$ provided at the reverse coupled port 106d is determined by a first reverse coupling factor between the output port and the reverse coupled port.

Excluding the subsequently described undesired signal, the amplitude of the coupled forward signal $b_3$ is proportional to the amplitude level of the forward signal. Excluding the subsequently described undesired signal, the signal at the reverse coupled port shall be referred to as the coupled reverse signal $b_4$, and the amplitude of the coupled reverse signal $b_4$ is proportional to the amplitude level of the reverse signal.

As described above a phase shifted portion of the input signal $a_1$ can be coupled to the reverse coupled port 106d, and can be undesirably included in the coupled reverse signal $b_4$. The phase shifted portion of the input signal $a_1$ coupled to the reverse coupled port 106d can be determined using a second forward coupling factor between the input port 106a and the reverse coupled port 106d.

Similarly, a phase shifted portion of the output reflected signal $a_2$ can be coupled to the forward coupled port 106c, and can be undesirably be included in the coupled forward signal $b_3$. The phase shifted portion of the output reflected signal $a_2$ coupled to the forward coupled port 106c can be determined using a second reverse coupling factor between the output port 106b and the forward coupled port 106c.

Typically, the portion of the output reflected signal $a_2$ coupled to the forward coupled port 106c is less than the portion of the input signal $a_1$ coupled to the forward coupled port 106c. Therefore, the effect of the undesired coupling of the output reflected signal $a_2$ is not significant, and therefore is not addressed in some embodiments. Further, each coupling factor is dependent upon coupler design.

The forward coupled port 106c and the reverse coupled port 106d of the bidirectional coupler 106 are coupled to at least one input of the ADC(s) 108. Thus, at least one input of the ADC(s) 108 is configured to receive the coupled reverse signal $b_4$ and the coupled forward signal $b_3$.

The ADC(s) 108 digitize the coupled forward signal $b_3$ and the coupled reverse signal $b_4$ generating respectively a digitized forward signal 107 and a digitized reverse signal 109. Assuming that the forward coupled port 106c and reverse coupled port 106d and the at least one input of the analog to digital converter circuitry 108 are impedance matched to the input(s) of the ADC(s) 108, the analog to digital converter circuitry 108 generates a digitized reverse signal 109 representing the amplitude and phase of the coupled reverse signal $b_4$, and generates a digitized forward signal 107 representing the amplitude and the phase of the coupled forward signal $b_3$.

The processing system 110 is configured to receive the digitized forward signal 107 and the digitized reverse signal 109 from the ADC(s) 108. Each of the signals generated by the processing system 110 described herein may be analog or digital signals, and voltage or current signals.

At least one output of the analog to digital converter circuitry 108 is coupled to at least one input of the processing system 110. Thus, the at least one input of the processing system 110 is configured to receive the digitized forward signal 107 and the digitized reverse signal 109. The processing system 110 is configured to generate an output signal 111.

Figure 1B:
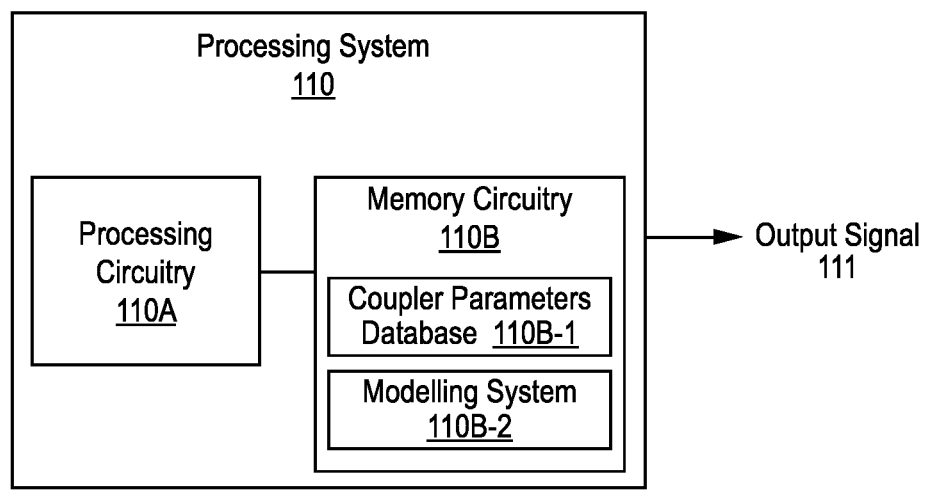
FIG. 1B illustrates a block diagram of one embodiment of a processing system.

FIG. 1B illustrates a block diagram of one embodiment of the processing system 110. The processing system 110 comprises processing circuitry 110A coupled to memory circuitry 110B. The processing system 110 may be implemented with analog and/or digital circuitry. For example, the processing circuitry 110A may be implemented with electronic analog circuitry, including circuitry used to implement electronic analog computers.

The memory circuitry 110B comprises a coupler parameters database 110B-1 and a modelling system 110B-2. The coupler parameters database 110B-1 stores electrical parameters, e.g. S-parameters, characterizing the bidirectional coupler. The coupler parameters database 110B-1 may be a conventional database, storage registers, a storage file, or any other means by which to store the electrical parameters.

The processing system 110 is configured to generate an output signal 111, e.g. a digital or analog signal, related to a value of reflected power (or the coupled reflected power), the reflection coefficient, and/or the VSWR. Optionally, the output signal 111 may be related to the input power or the forward coupled power. For example, the output signal 111 may be linearly or non-linearly proportional to the reflected power (or the coupled reflected power), the reflection coefficient, the VSWR, and/or the input power (or the coupled forward power).

The modelling system 110B-2 comprises a system for more accurately modelling a reflection coefficient of the load and/or voltage standing wave ratio (VSWR) of the load. The modelling system utilizes the following models.

Knowing the electrical parameters of the bidirectional coupler, the amplitude and phase of the output reflected signal $a_2$ can be more accurately determined by subtracting the contribution of the input signal $a_1$ coupled to the fourth port 106d from the coupled reverse signal $b_4$:

$$a_2 = \frac{b_4 - (a_1 * S_{41})}{S_{42}} = \frac{b_4 - \left(\frac{b_3}{S_{31}} * S_{41}\right)}{S_{42}} \quad \text{(Equation 1)}$$

where $S_{31}$, $S_{41}$, and $S_{42}$ are transmission S-parameters respectively from the input port 106a to the forward coupled port 106c, from input port 106a to the reverse coupled port 106d, and from the output port 106b to the reverse coupled port 106d. Further, the forward coupled port 106c and reverse coupled port 106d are deemed well impedance matched, as discussed elsewhere herein, so that first reflected signal $a_3$ and second reflected $a_4$ are substantially zero.

Assuming that the level of the amplitude of the output reflected signal $a_2$ coupled to forward coupled port 106c is much less than the level of the amplitude of the input signal $a_1$ coupled to the forward coupled port 106c, the output signal $b_2$ is:

$$b_2 = a_1 * S_{21} = \frac{b_3}{S_{31}} * S_{21} \quad \text{(Equation 2)}$$

where $S_{21}$ is a transmission S-parameter respectively from input port 106a to the output port 106b. Further, the forward coupled port 106c and the reverse coupled port 106d are deemed well impedance matched so that first reflected signal $a_3$ and second reflected signal $a_4$ are zero.

The reflection coefficient $\Gamma$ is:

$$\Gamma = \frac{a_2}{b_2} = \frac{\left(\frac{b_4 - (a_1 * S_{41})}{S_{42}}\right)}{\left(\frac{b_3}{S_{31}} * S_{21}\right)} = \frac{\left(b_4 - \left(\frac{b_3}{S_{31}} * S_{41}\right)\right)}{S_{42} * \left(\frac{b_3}{S_{31}} * S_{21}\right)} \quad \text{(Equation 3)}$$

The reflection coefficient formula can be further refined to remove the reflected signal $a_2$ coupled to the forward coupled port 106c. As noted elsewhere herein, practically this may not be necessary as the level of the amplitude of the output reflected signal $a_2$ coupled to forward coupled port 106c is much less than the level of the amplitude of the input signal $a_1$ coupled to the forward coupled port 106c.

The voltage standing wave ratio is:

$$VSWR = \frac{1 + |r|}{1 - |r|} \quad \text{(Equation 4)}$$

Figure 1C:
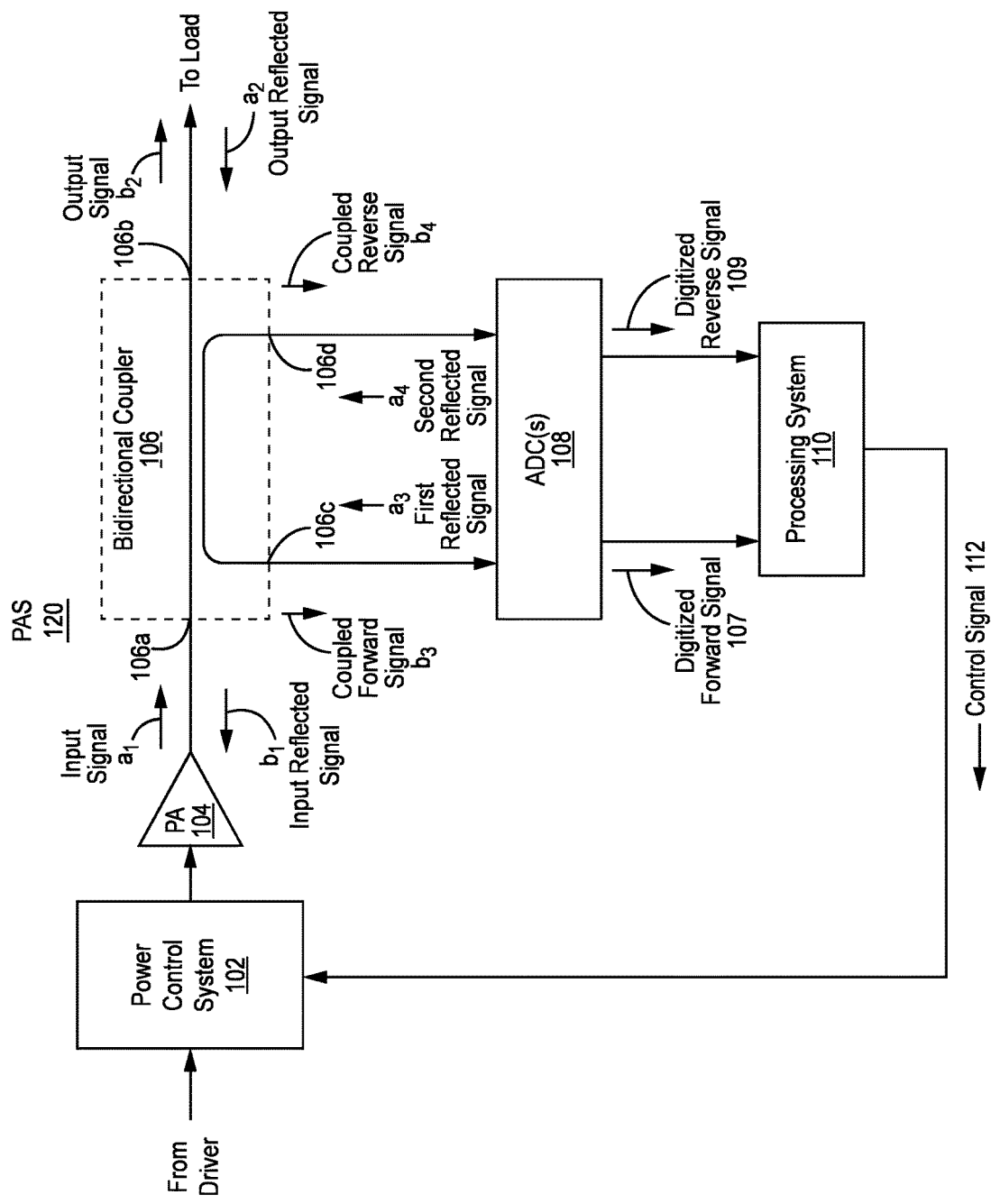
FIG. 1C illustrates a block diagram of one embodiment of a power amplifier system with enhanced reflection measurement.

FIG. 1C illustrates a block diagram of one embodiment of a power amplifier system (PAS) 120 with enhanced reflection measurement. For pedagogical reasons, the power amplifier system 120 with enhanced reflection measurement may also be referred to herein as a transmitter front end with enhanced reflection measurements (TX FE); however, the power amplifier system 120 with enhanced reflection measurement may be used in different (i.e. non-communication) applications such as in a microwave oven. The power amplifier system 120 with enhanced reflection measurement may be configured to use the enhanced reflection measurements to provide the protection function in the event the coupled reverse power or the reflection coefficient are excessive.

The PAS 120 may be configured to implement automatic level control (ALC) based on monitoring the coupled forward signal $b_3$. The ALC can be configured so as to diminish distortion in the power amplifier by adjusting a power level of a signal at the input of the power amplifier so that it remains below a threshold level. If the power level equals or exceeds the threshold level, the power level would drive the power amplifier into saturation, and generate non-linear amplification including distortion products. Thus, the power amplifier would no longer operate as a linear power amplifier.

The power amplifier system 120 with enhanced reflection measurement is configured to have a first input coupled to the output of a driver, e.g. a transmitter or any other type of driver or signal source, and an output coupled to the load. If the load is an antenna, or another device, a diplexer, duplexer, or transmit/receive switch may be coupled between the output port of a bidirectional coupler 106, and the antenna.

In one embodiment, the power amplifier system 120 with enhanced reflection measurement comprises a power control system 102, a power amplifier (PA) 104, a bidirectional coupler 106, analog to digital converter circuitry 108, and power control processing circuitry 110. The power amplifier 104 has an input coupled to an output of the power control system 102, and an output coupled to an input port 106a of the bidirectional coupler 106. The power control system 102 is configured to vary the power level of the signal input into the power amplifier 104. The power control system 102 may be a variable attenuator and/or a variable gain amplifier. The input of the power control system 102 is coupled to the output of the transmitter.

Optionally, a variable attenuator, e.g. having high and low attenuation states, is inserted between the forward coupling port and the corresponding input of the analog to digital converter circuitry 108 and/or the reverse coupling port and the corresponding input of the analog to digital converter circuitry 108. The variable attenuator(s) each have an input coupled to the processing system 110. The processing system 110 sends a signal, as required, to vary, e.g. dither, the attenuation level of the attenuator(s) so as to extend the dynamic range of the analog to digital converter circuitry 108.

The processing system 110 has an output configured to provide a control signal 112 generated by the power control processing circuitry 110 to prevent the amplifier 104 from:
a. being damaged by a level of reflected power at the output of the power amplifier 104 over a short period of time; and/or
b. being damaged by due to prolonged exposure to a high level of reflected power that is less than the level that would damage the power amplifier during the short period of time.

Optionally, the processing system 110 varies the control signal 112 to prevent the power amplifier 104 from saturating. A second input of the power control system 102 is coupled to the output of the processing system 110. Thus, the power control system 102 is configured to receive the control signal 112. The power control system 102 uses the control signal 112 to adjust its attenuation and/or gain, and thus control the power level of the signal provided to the input of the power amplifier 104.

The processing system 110 is configured to adjust the gain and/or attenuation of the power control system 102 to quickly reduce power levels of signals provided at the input of the power amplifier 104 upon the reverse power becoming too high, e.g. upon a level of the reverse signal level exceeding a first threshold level. Typically, the attenuation is increased, or the gain is reduced by a large amount, e.g. respectively to a maximum or minimum level. This prevents excessive level of reflected power from damaging the power amplifier 104 over a short time period, e.g. 1-10 microseconds. Such control is relatively fast and may be abrupt.

The power control processing circuitry 110 is also configured to adjust the gain and/or attenuation of the power control system 102 to prevent the power amplifier 104 from:
(a) being damaged due to prolonged exposure, e.g. greater than 500 milliseconds, to a high level of reflected power (but not high enough to engage the aforementioned fast control) indicated by a high voltage standing wave ratio (at the output port 106d of the bidirectional coupler 106) that is equal to or greater than a second threshold value, e.g. greater than 2:1; or
(b) saturating indicated by a high forward voltage level exceeding a third threshold level.

Such control is relatively slow. With respect to at least saturation prevention, the gain and/or attenuation changes are typically incremental and not be abrupt. With respect to the high standing wave ratio mentioned above, the adjustment to prevent damage due to the high VSWR is based upon a linear or non-linear function of VSWR.

For example, if the VSWR increases from below 2:1 to 2.5:1 and the second threshold level is a VSWR of 2:1, then the attenuation is increased (or the gain is decreased) by a fixed amount, e.g. about 7 decibels (for example from ten percent to fifty percent). For example, if the VSWR increases from below 2.25:1 to 2.5:1 and the second threshold level is a VSWR of 2.25:1, then the attenuation is increased (or the gain is decreased) by a fixed amount, e.g. about 4.8 decibels (for example from ten percent to thirty percent). Note, that as the second threshold level increases, the attenuation level drops for a given VSWR. Optionally, the second threshold level will be less than the first threshold level.

Optionally, the second threshold level may be a linear and/or non-linear function of one or more parameters, such as temperature. For example, if the reflected power level is below a reflected power threshold level due to the forward power level being below a forward power threshold level, then the reflected power will not damage, even over an extended period of time, the power amplifier 104. Whether the reflected power level is below the reflected power threshold level may be ascertained by determining if the forward voltage level is below a forward voltage threshold level and/or the reverse voltage level is below a reverse voltage threshold level. Thus, for example, the second threshold level may be a function of the forward voltage level and/or the reverse voltage level. Typically, the second threshold level will be increased if the forward voltage level is below a forward voltage threshold level and/or the reverse voltage level is below a reverse voltage threshold level. The second threshold level may be increased sufficiently high to effectively disable the control loop for protecting the power amplifier 104 against prolonged exposure to a high level of reflected power, but only while the forward voltage level is below a forward voltage threshold level and/or the reverse voltage level is below a reverse voltage threshold level.

Optionally, to prevent saturation of the power amplifier 104, the adjustment of the power control processing system is based upon a linear or non-linear function of the forward voltage. The forward voltage is proportional to the level of the forward power, and thus is related to the power level at the input of the power amplifier 104. The power control system 102 is adjusted when the forward voltage is equal to or exceeds a third threshold level. The attenuation or gain of the power control system 102 is respectfully increased or diminished until the forward voltage is less than or is equal to the third threshold level. Optionally, the third threshold level corresponds to an output power level of the power amplifier 104 at or below the output power level at which the power amplifier 104 saturates. Also, the first threshold level, the second threshold level, and/or the third threshold level may be either stored in and/or generated by the power control processing circuitry 110. Further, the first threshold level, the second threshold level, and/or the third threshold level may be determined from testing the corresponding power amplifier 104, and/or performing mathematical analysis.

The power amplifier system 120 with enhanced reflection measurement described above can be implemented in various types of systems, e.g. communications systems. For example, the power amplifier system 120 with enhanced reflection measurement described above can be implemented in various types of repeater systems. Repeater systems can be implemented in various ways.

Figure 2A:
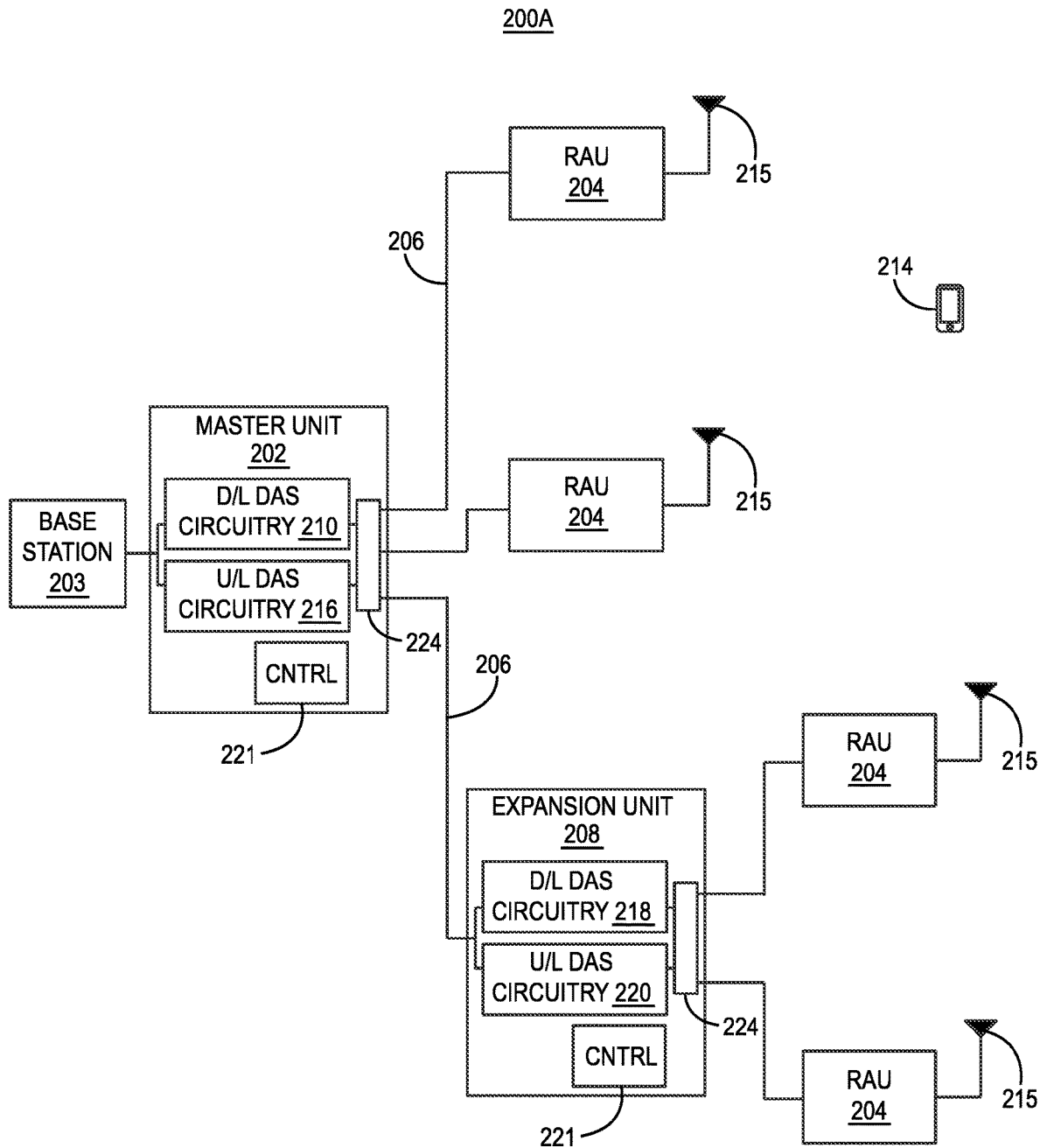
FIG. 2A illustrates a block diagram of one embodiment of a distributed antenna system in which the power amplifier with enhanced reflection measurement described herein is implemented.

For example, a repeater system can be implemented as a distributed antenna system (DAS). FIG. 2A illustrates a block diagram of one embodiment of a distributed antenna system 200A in which the power amplifier system with enhanced reflection measurement described herein is implemented.

The DAS 200A comprises one or more master units 202 that are communicatively coupled to one or more remote antenna units (RAUs) 204 via one or more waveguides 206, e.g. optical fibers or cables. Each remote antenna unit 204 can be communicatively coupled directly to one or more of the master units 202 or indirectly via one or more other remote antenna units 204 and/or via one or more expansion (or other intermediary) units 208. Each RAU 204 is configured to be coupled to one or more antennas 215. However, in an alternative embodiment, a RAU may include the one or more antennas.

The DAS 200A is coupled to one or more base stations 203 and is configured to improve the wireless coverage provided by the base stations 203. The capacity of each base station 203 can be dedicated to the DAS or can be shared among the DAS and a base station antenna system that is co-located with the base station and/or one or more other repeater systems.

In the embodiment shown in FIG. 2A, the capacity of one or more base stations 203 are dedicated to the DAS 200A and are co-located with the DAS 200A. The base stations 203 are coupled to the DAS 200A. It is to be understood however that other embodiments can be implemented in other ways. For example, the capacity of one or more base stations 203 can be shared with the DAS 200A and a base station antenna system co-located with the base stations 203 (for example, using a donor antenna). The base stations 203 can include one or more base stations that are used to provide commercial cellular wireless service and/or one or more base stations that are used to provide public and/or private safety wireless services (for example, wireless communications used by emergency services organizations (such as police, fire and emergency medical services) to prevent or respond to incidents that harm or endanger persons or property).

The base stations 203 can be coupled to the master units 202 using a network of attenuators, combiners, splitters, amplifiers, filters, cross-connects, etc., (sometimes referred to collectively as a "point-of-interface" or "POI"). This network can be included in the master units 202 and/or can be separate from the master units 202. This is done so that, in the downlink, the desired set of RF channels output by the base stations 203 can be extracted, combined, and routed to the appropriate master units 202, and so that, in the upstream, the desired set of carriers output by the master units 202 can be extracted, combined, and routed to the appropriate interface of each base station 203. It is to be understood, however, that this is one example and that other embodiments can be implemented in other ways.

In general, each master unit 202 comprises downlink (D/L) DAS circuitry 210 that is configured to receive one or more downlink signals from one or more base stations 203. Each base station downlink signal includes one or more radio frequency channels used for communicating in the downlink direction with user equipment 214 over the relevant wireless air interface. Typically, each base station downlink signal is received as an analog radio frequency signal, though in some embodiments one or more of the base station signals are received in a digital form (for example, in a digital baseband form complying with the Common Public Radio Interface ("CPRI") protocol, Open Radio Equipment Interface ("ORI") protocol, the Open Base Station Standard Initiative ("OBSAI") protocol, or other protocol). The downlink DAS circuitry 210 in each master unit 202 is also configured to generate one or more downlink transport signals derived from one or more base station downlink signals and to transmit one or more downlink transport signals to one or more of the remote antenna units 204.

Each RAU 204 is configured to receive the downlink transport signals transmitted to it from one or more master units 202 and to use the received downlink transport signals to generate one or more downlink radio frequency signals that are radiated from one or more antennas associated with that remote antenna unit 204 for reception by user equipment 214. In this way, the DAS 200A increases the coverage area for the downlink capacity provided by the base station(s) 203.

Also, each RAU 404 is configured to receive one or more uplink radio frequency signals transmitted from the user equipment 414. These signals are analog radio frequency signals.

Each RAU 404 is also configured to generate one or more uplink transport signals derived from the one or more remote uplink radio frequency signals and to transmit one or more uplink transport signals to one or more of the master units 402.

Figure 2B:
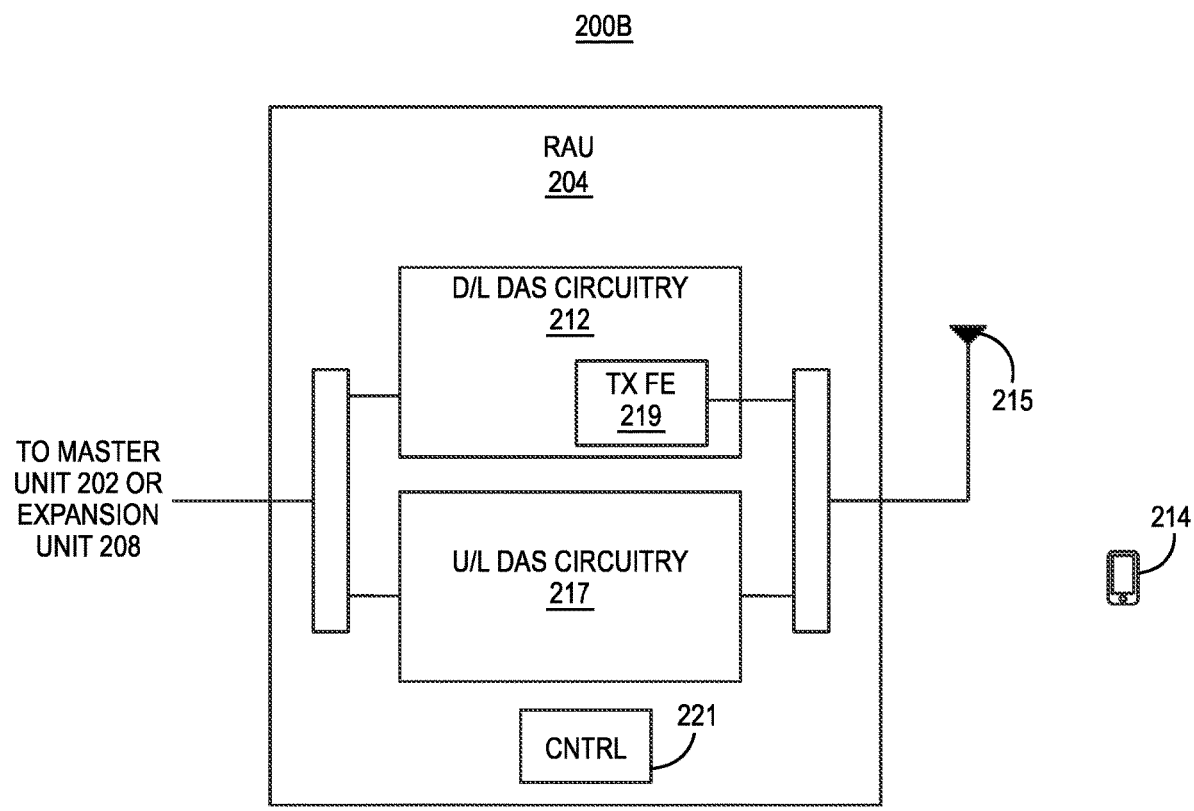
FIG. 2B illustrates a block diagram of one embodiment of a remote antenna unit in which the power amplifier with enhanced reflection measurement described herein is implemented.

FIG. 2B illustrates a block diagram of one embodiment of a remote antenna unit 200B in which the power amplifier with enhanced reflection measurement described herein is implemented. Each remote antenna unit 204 comprises downlink DAS circuitry 212 that is configured to receive the downlink transport signals transmitted to it from one or more master units 202 and to use the received downlink transport signals to generate one or more downlink radio frequency signals that are radiated from one or more antennas 215 associated with that remote antenna unit 204 for reception by user equipment 214. In this way, the DAS 200A increases the coverage area for the downlink capacity provided by the base stations 203. The downlink DAS circuitry 212 of each RAU 204 includes at least one transmitter front end having a power amplifier with enhanced reflection measurement 219 which, for example, power amplifies the downlink radio frequency signals.

Also, each remote antenna unit 204 comprises uplink (U/L) DAS circuitry 217 that is configured to receive one or more uplink radio frequency signals transmitted from the user equipment 214. These signals are analog radio frequency signals.

The uplink DAS circuitry 217 in each remote antenna unit 204 is also configured to generate one or more uplink transport signals derived from the one or more remote uplink radio frequency signals and to transmit one or more uplink transport signals to one or more of the master units 202. The uplink DAS circuitry 217 of each RAU 204 may include at least one receiver front end which e.g. amplifies received remote uplink radio frequency signals.

Returning to FIG. 2A, each master unit 202 comprises uplink (U/L) DAS circuitry 216 that is configured to receive the respective uplink transport signals transmitted to it from one or more remote antenna units 204 and to use the received uplink transport signals to generate one or more base station uplink radio frequency signals that are provided to the one or more base stations 203 associated with that master unit 202. Typically, this involves, among other things, combining or summing uplink signals received from multiple remote antenna units 204 in order to produce the base station signal provided to each base station 203. In this way, the DAS 200A increases the coverage area for the uplink capacity provided by the base stations 203.

Each expansion unit 208 comprises downlink (D/L) DAS circuitry 218 that is configured to receive the downlink transport signals transmitted to it from the master unit 202 (or other expansion unit 208) and transmits the downlink transport signals to one or more remote antenna units 204 or other downstream expansion units 208. Each expansion unit 208 also comprises uplink DAS circuitry 220 that is configured to receive the respective uplink transport signals transmitted to it from one or more remote antenna units 204 or other downstream expansion units 208, combine or sum the received uplink transport signals, and transmit the combined uplink transport signals upstream to the master unit 202 or other expansion unit 208. In other embodiments, one or more remote antenna units 204 are coupled to one or more master units 202 via one or more other remote antenna units 204 (for example, where the remote antenna units 204 are coupled together in a daisy chain or ring topology).

The downlink DAS circuitry (D/L DAS circuitry) 210, 212, and 218 and uplink DAS circuitry (U/L DAS circuitry) 216, 217, and 220 in each master unit 202, remote antenna unit 204, and expansion unit 208, respectively, can comprise one or more appropriate connectors, attenuators, combiners, splitters, amplifiers, filters, diplexers, duplexers, transmit/receive switches, analog-to-digital converters, digital-to-analog converters, electrical-to-optical converters, optical-to-electrical converters, mixers, field-programmable gate arrays (FPGAs), microprocessors, transceivers, framers, etc., to implement the features described above. Also, the downlink DAS circuitry 210, 212, and 218 and uplink DAS circuitry 216, 217, and 220 may share common circuitry and/or components.

The DAS 200A can use digital transport, analog transport, or combinations of digital and analog transport for generating and communicating the transport signals between the master units 202, the remote antenna units 204, and any expansion units 208. Each master unit 202, remote antenna unit 204, and expansion unit 208 in the DAS 200A also comprises a respective controller (CNTRL or controller circuitry) 221. The controller 221 is implemented using one or more programmable processors that execute software that is configured to implement the various control functions. The controller 221 (more specifically, the various control functions implemented by the controller 221) (or portions thereof) can be implemented in other ways (for example, in a field programmable gate array (FPGA), application specific integrated circuit (ASIC), etc.). Components of the power amplifier system with enhanced reflection measurement 120, e.g. the processing system 110 or a portion thereof, may be incorporated in, e.g. the controller 221 of a remote antenna unit 204 or in another controller 221 or state machine incorporated into the distributed antenna system 200A. Optionally, the processing system 110 may be part of one or more controllers 221.

In embodiments of the invention described herein, certain components, e.g. processing system, ADC(s), power detection circuitry, and components thereof, may be illustrated as being incorporated in a specific section of a communications system, e.g. a RAU of a DAS. However, such components may be in other sections of the corresponding communications system, e.g. in a master unit, expansion unit, and/or a base station.

The at least one transmitter front end having a power amplifier with enhanced reflection measurement 219 includes at least one of the power amplifier systems with enhanced reflection measurement 120 described above. Further, a combination of one or more diplexers, duplexers, transmit/receive switches duplexers and/or other combiner systems can be used to couple the downlink (D/L) DAS circuitry 212 (e.g. including the at least one transmitter front end 219) and the uplink DAS circuitry 217 to one or more antennas 215. The power amplifier system with enhanced reflection measurement 120 may be incorporated, e.g. in the controller 221 of a remote antenna unit 204 or in another controller 221 otherwise incorporated into the distributed antenna system 200A.

Figure 3:
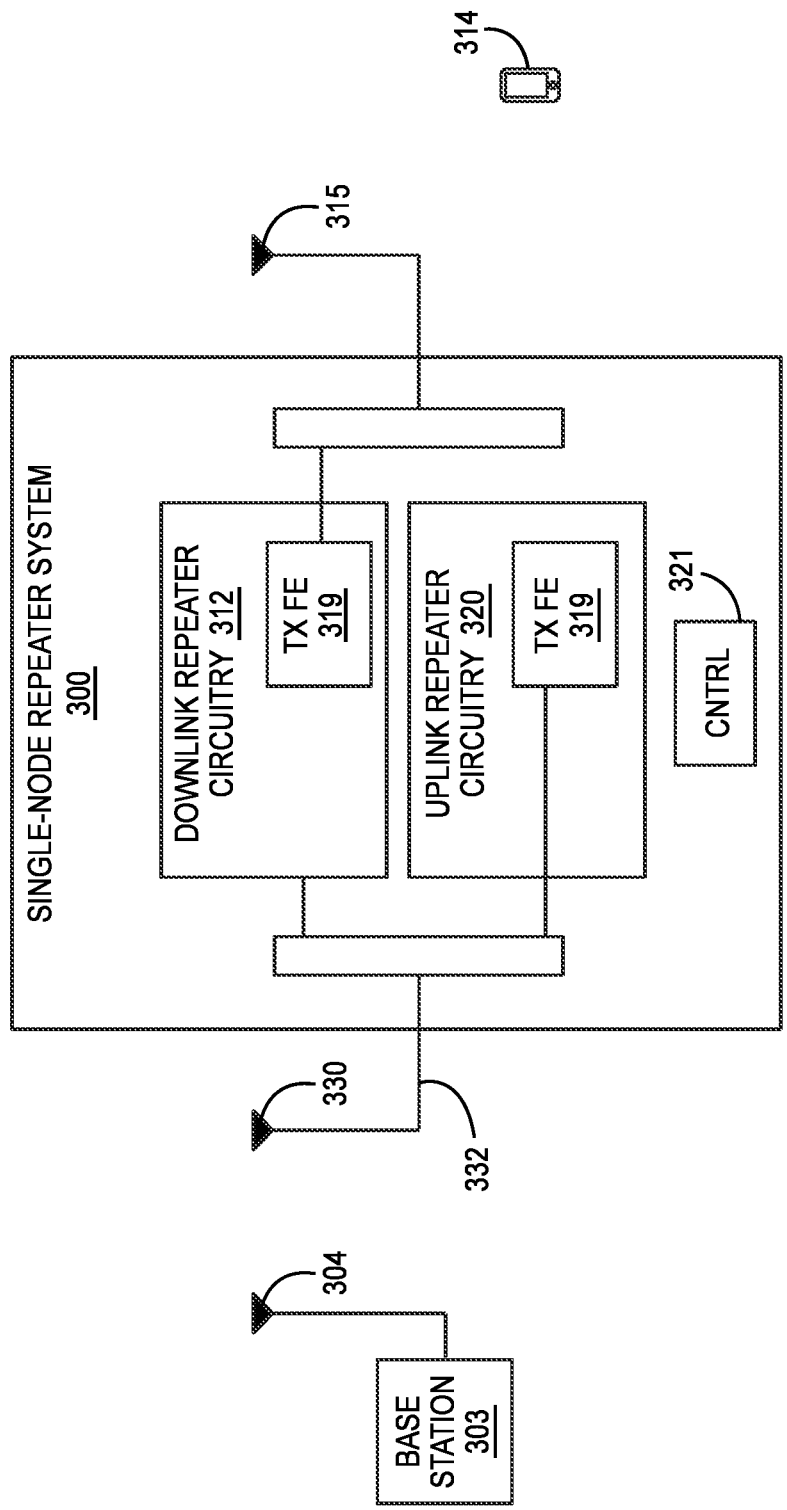
FIG. 3 illustrates a block diagram of one embodiment of a single-node repeater in which the power amplifier with enhanced reflection measurement described herein is implemented.

Repeater systems can be implemented in other ways. For example, a repeater system can be implemented as a single-node repeater. FIG. 3 illustrates a block diagram of one embodiment of a single-node repeater 300 in which the power amplifier with enhanced reflection measurement described herein is implemented.

The single-node repeater 300 is configured to facilitate wireless communications between one or more base stations 303 and user equipment 314 (e.g. a mobile phone, tablet, or computer). Such wireless communication can be through uplink repeater circuitry 320 to the base station(s) 303 and a downlink repeater circuitry 312 to the user equipment 314.

The single-node repeater 300 comprises the downlink repeater circuitry 312 that is configured to receive one or more downlink signals from the one or more base stations 303. These signals are also referred to here as "base station downlink signals." Each base station downlink signal includes one or more radio frequency channels used for communicating in the downlink direction with user equipment (UE) 314 over the relevant wireless air interface. Typically, each base station downlink signal is received as an analog radio frequency signal.

The downlink repeater circuitry 312 in the single-node repeater 300 is also configured to generate one or more downlink radio frequency signals that are radiated from one or more antennas 315 associated with the single-node repeater 300 for reception by user equipment 314. These downlink radio frequency signals are analog radio frequency signals and are also referred to here as "repeated downlink radio frequency signals." Each repeated downlink radio frequency signal includes one or more of the downlink radio frequency channels used for communicating with user equipment 314 over the wireless air interface. In this exemplary embodiment, the single-node repeater 300 is an active repeater system in which the downlink repeater circuitry 312 comprises one or more amplifiers (or other gain elements) that are used to control and adjust the gain of the repeated downlink radio frequency signals radiated from the one or more antennas 315. The downlink repeater circuitry 312 includes at least one transmitter front end having a power amplifier with enhanced reflection measurement 319 which, for example, power amplifies the repeated downlink radio frequency signals.

Also, the single-node repeater 300 comprises uplink repeater circuitry 320 that is configured to receive one or more uplink radio frequency signals transmitted from the user equipment 314. These signals are analog radio frequency signals and are also referred to here as "UE uplink radio frequency signals." Each UE uplink radio frequency signal includes one or more radio frequency channels used for communicating in the uplink direction with user equipment 314 over the relevant wireless air interface.

The uplink repeater circuitry 320 in the single-node repeater 300 is also configured to generate one or more uplink radio frequency signals that are provided to the one or more base stations 303. These signals are also referred to here as "repeated uplink signals." Each repeated uplink signal includes one or more of the uplink radio frequency channels used for communicating with user equipment 314 over the wireless air interface. In this exemplary embodiment, the single-node repeater 300 is an active repeater system in which the uplink repeater circuitry 320 comprises one or more amplifiers (or other gain elements) that are used to control and adjust the gain of the repeated uplink radio frequency signals provided to the one or more base stations 303. Typically, each repeated uplink signal is provided to the one or more base stations 303 as an analog radio frequency signal. The uplink repeater circuitry 320 may include at least one receiver front end which e.g. amplifies received uplink radio frequency signals.

The downlink repeater circuitry 312 and uplink repeater circuitry 320 can comprise one or more appropriate connectors, attenuators, combiners, splitters, amplifiers, filters, diplexers, duplexers, transmit/receive switches, analog-to-digital converters, digital-to-analog converters, electrical-to-optical converters, optical-to-electrical converters, mixers, field-programmable gate arrays (FPGAs), microprocessors, transceivers, framers, etc., to implement the features described above. Also, the downlink repeater circuitry 312 and uplink repeater circuitry 320 may share common circuitry and/or components.

The at least one transmitter front end 319 includes at least one of the transmitter front end having a power amplifier with enhanced reflection measurement 120 described above. Further, a combination of two or more diplexers, duplexers, transmit/receive switches duplexers and/or other combiner systems can be used to couple the downlink DAS circuitry 312 (e.g. including the at least one transmitter front end 319) and the uplink DAS circuitry 320 (e.g. including the at least one transmitter front end 319) to one or more antennas 315. The single-node repeater system 300 also comprises a controller (CNTRL) 321. The controller 321 is implemented using one or more programmable processors that execute software that is configured to implement the various control functions. The controller 321 (more specifically, the various control functions implemented by the controller 321) (or portions thereof) can be implemented in other ways (for example, in a field programmable gate array (FPGA), application specific integrated circuit (ASIC), etc.). The components of the power amplifier system with enhanced reflection measurement 120, e.g. the processing system 110 or a portion thereof, may be incorporated, e.g. in the controller 321 of the single-node repeater system 300.

Figure 4:
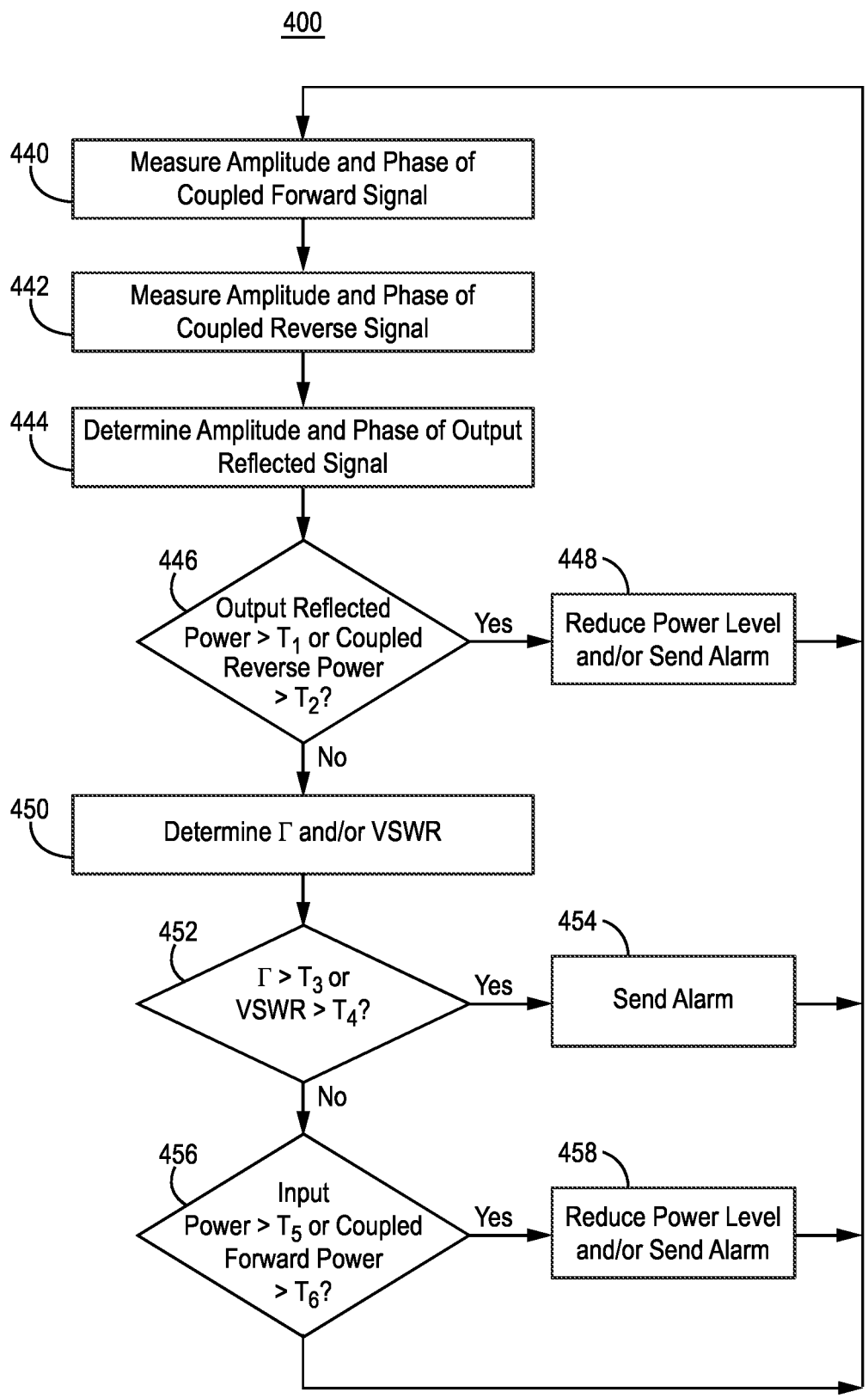
FIG. 4 illustrates a flow diagram of one embodiment of a method of enhanced reflection measurement.

FIG. 4 illustrates a flow diagram of one embodiment of a method of enhanced reflection measurement 400. To the extent that the embodiment of method 400 shown in FIG. 4 is described herein as being implemented in the systems described with respect to FIGS. 1-3, it is to be understood that other embodiments can be implemented in other ways. The blocks of the flow diagrams have been arranged in a generally sequential manner for ease of explanation; however, it is to be understood that this arrangement is merely exemplary, and it should be recognized that the processing associated with the methods (and the blocks shown in the Figures) can occur in a different order (for example, where at least some of the processing associated with the blocks is performed in parallel and/or in an event-driven manner).

In block 440, measure an amplitude and phase of coupled forward signal $b_3$ at a forward coupled port of a bidirectional coupler. In block 442, measure an amplitude and phase of coupled reverse signal $b_4$ at a reverse coupled port of the bidirectional coupler. Optionally, such amplitude and phase information is digitized, and the subsequent processing is performed in the digital domain; alternatively, such information is not digitized, and the processing is performed in the analog domain.

In block 444, determine the output reflected signal $a_2$ at the output port 106b using electrical parameters of the bidirectional coupler 106 such as an electrical transmission parameter from an input port 106a to the forward coupled port 106c, an electrical transmission parameter from the input port 106a to the reverse coupled port 106d, and an electrical transmission parameter from an output port 106b to the reverse coupled port 106d. For example for electrical parameters that are S-parameters, the reflected signal is:

$$a_2 = \frac{b_4 - (a_1 * S_{41})}{S_{42}}.$$

Optionally, in block 446, determine if at least one of the output reflected power exceeds a reflected power threshold ($T_1$) and the coupled reverse power exceeds a coupled reverse power threshold ($T_2$). If at least one of the reflected power exceeds the reflected power threshold and the coupled reverse power exceeds the coupled reverse power threshold, then, in block 448, perform at least one of: reducing the power level of the signal at the input port of the bidirectional coupler until at least one of the reflected power is less than or equal to the reflected power threshold and the coupled reverse power is less than or equal to the coupled reverse power threshold, and providing an alarm indicating that at least one of the reflected power exceeds a reflected power threshold and the coupled reverse power exceeds a coupled reverse power threshold. The alarm may be a message or signal sent to a network operator and/or an indicator, such as a flashing light, e.g. an LED, in a corresponding PAS to identify a faulty part to maintenance personnel. The alarms described herein may notify communication system operators of problems arising from high reflected powers, reflection coefficients Optionally, in block 448, reduce the power level, e.g. by fifty percent or more, by seventy five percent or more, or by ninety nine percent or more, for example by adjusting the power control system 102. Optionally, reduce the power level of the signal comprises reduce a power level of an output signal of a signal source that is a power amplifier having an output coupled to the input port. Optionally after block 448, stop, or proceed to blocks 450, 456, or 440. If at least one of the reflected power does not exceed the reflected power threshold and the coupled reverse power does not exceed the coupled reverse power threshold, then stop, or proceed to blocks 450, 456, or 440.

Optionally, in block 450, determine at least one of a reflection coefficient (Γ) at the output port and a voltage standing wave ratio (VSWR) at the output port, where the reflection coefficient and voltage standing wave ratio are determined for a load coupled to the output port, and where:

the reflection coefficient is a function of the output reflected signal $a_2$, e.g.

$$\Gamma = \frac{a_2}{\left(\frac{b_3}{S_{31}} * S_{21}\right)};$$

$$VSWR = \frac{1 + |r|}{1 - |r|};$$

and where $S_{21}$ is a transmission S-parameter from the input port to the output port. Optionally, the reflection coefficient and VSWR are calculated as set forth above, e.g. using Equation 3. However, optionally, the equation of reflection coefficient (Equation 3) can be modified to subtract the output reflected signal $a_2$ coupled to the forward coupled port 106c. As discussed above, this is not typically required for the reasons described above.

Optionally, in block 452, determine if at least one of the reflection coefficient exceeds a reflection coefficient threshold ($T_3$), and the VSWR exceeds a VSWR threshold ($T_4$). If at least one of the reflection coefficient exceeds the reflection coefficient threshold and the VSWR exceeds the VSWR threshold, then in block 454 provide an alarm indicating a reflection coefficient that exceeds the reflection coefficient threshold, or a VSWR that exceeds the VSWR threshold. The alarm may be a message or signal sent to a network operator and/or an indicator, such as a flashing light, e.g. an LED, in a corresponding PAS to identify a faulty part to maintenance personnel.

Optionally after block 454, stop, or proceed to blocks 456 or 440. If at least one of the reflection coefficient does not exceed the reflection coefficient threshold and the VSWR does not exceed the VSWR threshold, then stop, or proceed to blocks 456 or 440.

Optionally, in block 456, determine if at least one of an input power at the input port is equal to or exceeds an input power threshold level ($T_5$), and the coupled forward power is equal to or exceeds a coupled forward power threshold ($T_6$). If at least one of the input power is equal to or exceeds the input power threshold level and the coupled forward power is equal to or exceeds the coupled forward power, then in block 458 perform at least one of: reduce a power level of the input power until at least one of the input power at the input port less than an input power threshold level and the coupled forward power is less than the coupled forward power threshold, and provide an alarm indicating the automatic limiting control function has been enabled. Controlling the input power may ensure that the signal source, e.g. a power amplifier, continues to provide linear power amplification and thus maintains a higher power added efficiency of the signal source.

Optionally, reducing the power level of the signal comprises reducing a power level of an output signal of a signal source that is a power amplifier having an output coupled to the input port. Optionally, after block 456 or block 458, subsequently proceed to block 440 or stop. If the power output from the power amplifier does not equal or exceed the third threshold, then optionally proceed to block 440 or stop.

The processor circuitry described herein may include one or more microprocessors, microcontrollers, digital signal processing (DSP) elements, application-specific integrated circuits (ASICs), complex programmable logic devices, and/or field programmable gate arrays (FPGAs). In this exemplary embodiment, processor circuitry includes or functions with software programs, firmware, or other computer readable instructions for carrying out various process tasks, calculations, and control functions, used in the methods described herein. These instructions are typically tangibly embodied on any storage media (or computer readable medium) used for storage of computer readable instructions or data structures.

The memory circuitry described herein can be implemented with any available storage media (or computer readable media) that can be accessed by a general purpose or special purpose computer or processor, or any programmable logic device. Suitable computer readable medium may include storage or memory media such as semiconductor, magnetic, and/or optical media. For example, computer readable media may include conventional hard disks, Compact Disk-Read Only Memory (CD-ROM), DVDs, volatile or non-volatile media such as Random Access Memory (RAM) (including, but not limited to, Dynamic Random Access Memory (DRAM)), Read Only Memory (ROM), Electrically Erasable Programmable ROM (EEPROM), and/or flash memory. Combinations of the above are also included within the scope of computer readable media.

Exemplary Embodiments

Example 1 includes a method, comprising: measuring amplitude and phase of a coupled forward signal at a forward coupled port of a bidirectional coupler; measuring an amplitude and a phase of a coupled reverse signal at a reverse coupled port of the bidirectional coupler; and determining an amplitude and a phase of an output reflected signal at the output port as a function of the following: the amplitude and the phase of the coupled forward signal coupled into the forward coupled port; the amplitude and the phase of the coupled reverse signal coupled into the reverse coupled port; an electrical transmission parameter from an input port of the bidirectional coupler to the forward coupled port; an electrical transmission parameter from the input port to the reverse coupled port; and an electrical transmission parameter from an output port of the bidirectional coupler to the reverse coupled port.

Example 2 includes the method of Example 1, wherein determining the output reflected signal at the output port is determined with S-parameters according to:

$$\frac{b_4 - \left(\frac{b_3}{S_{31}} * S_{41}\right)}{S_{42}};$$

where $b_3$ is the coupled forward signal coupled into the forward coupled port; where $b_4$ is the coupled reverse signal coupled into the reverse coupled port; where $S_{31}$ is the transmission S-parameter from the input port of the bidirectional coupler to the forward coupled port; where $S_{41}$ is the transmission S-parameter from the input port to the reverse coupled port; and where $S_{42}$ is the transmission S-parameter from the output port of the bidirectional coupler to the reverse coupled port.

Example 3 includes the method of any of Examples 1-2, further comprising: determining if at least one of the output reflected power exceeds a reflected power threshold and the coupled reverse power exceeds a coupled reverse power threshold; and if at least one of the output reflected power exceeds the reflected power threshold and the coupled reverse power exceeds the coupled reverse power threshold, then performing at least one of: reducing the power level of the signal at the input port of the bidirectional coupler until at least one of the output reflected power is less than or equal to the reflected power threshold and the coupled reverse power is less than or equal to the coupled reverse power threshold, and providing an alarm indicating that at least one of the output reflected power exceeds a reflected power threshold and the coupled reverse power exceeds a coupled reverse power threshold.

Example 4 includes the method of Example 3, wherein reducing the power level of the signal comprises reducing a power level of an output signal of a signal source that is a power amplifier having an output coupled to the input port.

Example 5 includes the method of any of Examples 1-4, further comprising: determining at least one of a reflection coefficient ($\Gamma$) at the output port and a voltage standing wave ratio (VSWR) at the output port, where the reflection coefficient and voltage standing wave ratio are determined for a load coupled to the output port, and where: the reflection coefficient is a function of the output reflected signal; and $$VSWR = \frac{1 + |\Gamma|}{1 - |\Gamma|}.$$

Example 6 includes the method of Example 5, further comprising: determining if at least one of a reflection coefficient exceeds a reflection coefficient threshold and a VSWR exceeds a VSWR threshold; if at least one of the reflection coefficient exceeds a reflection coefficient threshold and the VSWR exceeds a VSWR threshold, then providing an alarm indicating that at least one of: the reflection coefficient exceeds the reflection coefficient threshold and the VSWR exceeds the VSWR threshold.

Example 7 includes the method of any of Examples 1-6, wherein further comprising: determining if at least one of an input power at the input port is equal to or exceeds an input power threshold level, and the coupled forward power is equal to or exceeds a coupled forward power threshold; and if at least one of the input power is equal to or exceeds the input power threshold level and the coupled forward power is equal to or exceeds the coupled forward power, performing at least one of: reducing a power level of the input power until at least one of the input power at the input port less than an input power threshold level and the coupled forward power is less than the coupled forward power threshold, and providing an alarm indicating the automatic limiting control function has been enabled.

Example 8 includes the method of Example 7, wherein reducing the power level of the signal comprises reducing a power level of an output signal of a signal source that is a power amplifier having an output coupled to the input port.

Example 9 includes a system, comprising: a bidirectional coupler having an input port, an output port, a forward coupled port, and a reverse coupled port, where the input port is configured to receive input signal from a signal source coupled to the input port, and the output port is configured to provide output signal to a load coupled to the output port; at least one analog to digital converter circuit having at least one input coupled to the forward coupled port and the reverse coupled port, and at least one output; a processing system, comprising processing circuitry coupled to memory circuitry, having at least one input coupled to the at least one output of the at least one analog to digital converter circuit, and an output configured to generate an output signal related to a level of at least one of a coupled reverse signal and an output reflected signal; and wherein the power control processing circuitry is configured to: measure an amplitude and a phase of a coupled forward signal at a forward coupled port of a bidirectional coupler; measure an amplitude and a phase of a coupled reverse signal at a reverse coupled port of the bidirectional coupler; and determine an amplitude and a phase of an output reflected signal at the output port as a function of the following: the amplitude and the phase of the coupled forward signal coupled into the forward coupled port; the amplitude and the phase of the coupled reverse signal coupled into the reverse coupled port; an electrical transmission parameter from an input port of the bidirectional coupler to the forward coupled port; an electrical transmission parameter from the input port to the reverse coupled port; and an electrical transmission parameter from an output port of the bidirectional coupler to the reverse coupled port.

Example 10 includes the system of Example 9, where the power control processing circuitry is configured to determine the output reflected signal at the output port is determined with S-parameters according to:

$$\frac{b_4 - \left(\frac{b_3}{S_{31}} * S_{41}\right)}{S_{42}};$$

where $b_3$ is the coupled forward signal coupled into the forward coupled port; where $b_4$ is the coupled reverse signal coupled into the reverse coupled port; where $S_{31}$ is the transmission S-parameter from the input port of the bidirectional coupler to the forward coupled port; where $S_{41}$ is the transmission S-parameter from the input port to the reverse coupled port; and where $S_{42}$ is the transmission S-parameter from the output port of the bidirectional coupler to the reverse coupled port.

Example 11 includes the system of any of Examples 9-10, wherein the processing system is further configured to: determine if at least one of the output reflected power exceeds a reflected power threshold and the coupled reverse power exceeds a coupled reverse power threshold; and if at least one of the output reflected power exceeds the reflected power threshold and the coupled reverse power exceeds the coupled reverse power threshold, perform at least one of: reduce the power level of the signal at the input port of the bidirectional coupler until at least one of the output reflected power is less than or equal to the reflected power threshold and the coupled reverse power is less than or equal to the coupled reverse power threshold, and provide an alarm indicating that at least one of the output reflected power exceeds a reflected power threshold and the coupled reverse power exceeds a coupled reverse power threshold.

Example 12 includes the system of Example 11, further comprising: a power control system coupled to the processing system; wherein the signal source is a power amplifier coupled to the power control system and the input port; and wherein reducing the power level comprises reducing an output power level of the power amplifier.

Example 13 includes the system of any of Examples 9-12, wherein the processing system is further configured to: determine at least one of a reflection coefficient ($\Gamma$) at the output port and a voltage standing wave ratio (VSWR) at the output port, where the reflection coefficient and voltage standing wave ratio are determined for a load coupled to the output port, and where:

the reflection coefficient is a function of the output reflected signal; and $$VSWR = \frac{1 + |r|}{1 - |r|}.$$

Example 14 includes the system of Example 13, wherein the processing system is further configured to: determine if at least one of a reflection coefficient exceeds a reflection coefficient threshold and a VSWR exceeds a VSWR threshold; if at least one of the reflection coefficient exceeds a reflection coefficient threshold and the VSWR exceeds a VSWR threshold, then provide an alarm indicating that at least one of: the reflection coefficient exceeds the reflection coefficient threshold and the VSWR exceeds the VSWR threshold.

Example 15 includes the system of any of Examples 9-14, wherein the processing system is further configured to: determine if at least one of an input power at the input port is equal to or exceeds an input power threshold level, and the coupled forward power is equal to or exceeds a coupled forward power threshold; and if at least one of the input power is equal to or exceeds the input power threshold level and the coupled forward power is equal to or exceeds the coupled forward power, perform at least one of: reduce a power level of the input power until at least one of the input power at the input port less than an input power threshold level and the coupled forward power is less than the coupled forward power threshold, and provide an alarm indicating the automatic limiting control function has been enabled.

Example 16 includes the system of Example 15, further comprising: a power control system; wherein the signal source is a power control system coupled to the processing system; wherein the power amplifier coupled to the power control system and the input port; and wherein reducing the power level comprises reducing an output power level of the power amplifier.

Example 17 includes the system of any of Examples 9-16, wherein the processing system is further configured to: determine if the input power is equal to or exceeds an input power threshold level; if the input power is equal to or exceeds the input power threshold level, perform at least one of reduce a power level of the input power until the input power is less than or equal to the input power threshold power level and provide an alarm indicating the automatic limiting control function has been enabled.

Example 18 includes the system of Example 17, further comprising: a power control system; wherein the signal source is a power control system coupled to the processing system; wherein the power amplifier coupled to the power control system and the input port; and wherein reducing the power level comprises reducing an output power level of the power amplifier.

Example 19 includes the system of any of Examples 9-18, wherein system comprises one of a remote antenna unit of a distributed antenna system and a single-node repeater.

Example 20 includes a program product comprising a non-transitory processor readable medium on which program instructions are embodied, wherein the program instructions are configured, when executed by at least one programmable processor, to cause the at least one programmable processor to: measure an amplitude and a phase of a coupled forward signal at a forward coupled port of a bidirectional coupler; measure an amplitude and a phase of a coupled reverse signal at a reverse coupled port of the bidirectional coupler; and determine an amplitude and a phase of an output reflected signal at the output port as a function of the following: the amplitude and the phase of the coupled forward signal coupled into the forward coupled port; the amplitude and the phase of the coupled reverse signal coupled into the reverse coupled port; an electrical transmission parameter from an input port of the bidirectional coupler to the forward coupled port; an electrical transmission parameter from the input port to the reverse coupled port; and an electrical transmission parameter from an output port of the bidirectional coupler to the reverse coupled port.

Example 21 includes the program product of Example 20, wherein the program instructions are configured, when executed by at least one programmable processor, to further cause the at least one programmable processor to determine the output reflected signal at the output port is determined with S-parameters according to:

$$\frac{b_4 - \left(\frac{b_3}{S_{31}} * S_{41}\right)}{S_{42}};$$

where $b_3$ is the coupled forward signal coupled into the forward coupled port; where $b_4$ is the coupled reverse signal coupled into the reverse coupled port; where $S_{31}$ is the transmission S-parameter from the input port of the bidirectional coupler to the forward coupled port; where $S_{41}$ is the transmission S-parameter from the input port to the reverse coupled port; and where $S_{42}$ is the transmission S-parameter from the output port of the bidirectional coupler to the reverse coupled port.

Example 22 includes the program product of any of Examples 20-21, wherein the program instructions are configured, when executed by at least one programmable processor, to further cause the at least one programmable processor to: determine if at least one of the output reflected power exceeds a reflected power threshold and the coupled reverse power exceeds a coupled reverse power threshold; and if at least one of the output reflected power exceeds the reflected power threshold and the coupled reverse power exceeds the coupled reverse power threshold, perform at least one of: reducing the power level of the signal at the input port of the bidirectional coupler until at least one of the output reflected power is less than or equal to the reflected power threshold and the coupled reverse power is less than or equal to the coupled reverse power threshold, and providing an alarm indicating that at least one of the output reflected power exceeds a reflected power threshold and the coupled reverse power exceeds a coupled reverse power threshold.

Example 23 includes the program product of Example 22, wherein reducing the power level of the signal comprises reducing a power level of an output signal of a signal source that is a power amplifier having an output coupled to the input port.

Example 24 includes the program product of any of Examples 20-23, wherein the program instructions are configured, when executed by at least one programmable processor, to further cause the at least one programmable processor to: determine at least one of a reflection coefficient ($\Gamma$) at the output port and a voltage standing wave ratio (VSWR) at the output port, where the reflection coefficient and voltage standing wave ratio are determined for a load coupled to the output port, and where: the reflection coefficient is a function of the output reflected signal; and $$VSWR = \frac{1 + |r|}{1 - |r|}.$$

Example 25 includes the program product of Example 24, wherein the program instructions are configured, when executed by at least one programmable processor, to further cause the at least one programmable processor to: determine if at least one of a reflection coefficient exceeds a reflection coefficient threshold and a VSWR exceeds a VSWR threshold; if at least one of the reflection coefficient exceeds a reflection coefficient threshold and the VSWR exceeds a VSWR threshold, then provide an alarm indicating that at least one of: the reflection coefficient exceeds the reflection coefficient threshold and the VSWR exceeds the VSWR threshold.

Example 26 includes the program product of any of Examples 20-25, wherein the program instructions are configured, when executed by at least one programmable processor, to further cause the at least one programmable processor to: determine if at least one of an input power at the input port is equal to or exceeds an input power threshold level, and the coupled forward power is equal to or exceeds a coupled forward power threshold; and if at least one of the input power is equal to or exceeds the input power threshold level and the coupled forward power is equal to or exceeds the coupled forward power, perform at least one of: reducing a power level of the input power until at least one of the input power at the input port less than an input power threshold level and the coupled forward power is less than the coupled forward power threshold, and providing an alarm indicating the automatic limiting control function has been enabled.

Example 27 includes the program product of Example 26, wherein reducing the power level of the signal comprises reducing a power level of an output signal of a signal source that is a power amplifier having an output coupled to the input port.

The terms "about" or "substantially" indicate that the value or parameter specified may be somewhat altered, as long as the alteration does not result in nonconformance of the process or structure to the illustrated embodiment. Finally, "exemplary" indicates the description is used as an example, rather than implying that it is an ideal.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims. Therefore, it is manifestly intended that this invention be limited only by the claims and the equivalents thereof.

The invention claimed is:

1. A method, comprising:
measuring amplitude and phase of a coupled forward signal at a forward coupled port of a bidirectional coupler;
measuring an amplitude and a phase of a coupled reverse signal at a reverse coupled port of the bidirectional coupler; and
determining an amplitude and a phase of an output reflected signal at an output port of the bidirectional coupler as a function of:
the amplitude and the phase of the coupled forward signal coupled into the forward coupled port; and
the amplitude and the phase of the coupled reverse signal coupled into the reverse coupled port.

2. The method of claim 1, wherein determining an amplitude and phase of the output reflected signal at the output port is determined with S-parameters according to:

$$\frac{b_4 - \left(\frac{b_3}{S_{31}} * S_{41}\right)}{S_{42}};$$

where $b_3$ is the coupled forward signal coupled into the forward coupled port;
where $b_4$ is the coupled reverse signal coupled into the reverse coupled port;
where $S_{31}$ is a transmission S-parameter from an input port of the bidirectional coupler to the forward coupled port;
where $S_{41}$ is a transmission S-parameter from the input port to the reverse coupled port; and
where $S_{42}$ is a transmission S-parameter from the output port of the bidirectional coupler to the reverse coupled port.

3. The method of claim 1, further comprising:
determining if at least one of an output reflected power exceeds a reflected power threshold and a coupled reverse power exceeds a coupled reverse power threshold; and
if at least one of the output reflected power exceeds the reflected power threshold and the coupled reverse power exceeds the coupled reverse power threshold, then performing at least one of: reducing a power level of an input signal at an input port of the bidirectional coupler until at least one of the output reflected power is less than or equal to the reflected power threshold and the coupled reverse power is less than or equal to the coupled reverse power threshold, and providing an alarm indicating that at least one of the output reflected power exceeds a reflected power threshold and the coupled reverse power exceeds the coupled reverse power threshold.

4. The method of claim 3, wherein reducing the power level of the input signal comprises reducing a power level of an output signal of a signal source that is a power amplifier having an output coupled to the input port.

5. The method of claim 1, further comprising:
determining at least one of a reflection coefficient ($\Gamma$) at the output port and a voltage standing wave ratio (VSWR) at the output port, where the reflection coefficient and the voltage standing wave ratio are determined for a load coupled to the output port, and where:
the reflection coefficient is a function of the output reflected signal; and $$VSWR = \frac{1+|r|}{1-|r|}.$$

6. The method of claim 5, further comprising:
determining if at least one of the reflection coefficient exceeds a reflection coefficient threshold and the VSWR exceeds a VSWR threshold; and
if at least one of the reflection coefficient exceeds the reflection coefficient threshold and the VSWR exceeds the VSWR threshold, then providing an alarm indicating that at least one of: the reflection coefficient exceeds the reflection coefficient threshold and the VSWR exceeds the VSWR threshold.

7. The method of claim 1, wherein further comprising:
determining if at least one of an input power at an input port is equal to or exceeds an input power threshold, and a coupled forward power is equal to or exceeds a coupled forward power threshold; and
if at least one of the input power is equal to or exceeds the input power threshold and the coupled forward power is equal to or exceeds the coupled forward power threshold, performing at least one of: reducing a power level of the input power until at least one of the input power at the input port less than an input power threshold and the coupled forward power is less than the coupled forward power threshold, and providing an alarm indicating an automatic limiting control function has been enabled.

8. The method of claim 7, wherein reducing the power level of the input power comprises reducing a power level of an output signal of a signal source that is a power amplifier having an output coupled to the input port.

9. A system, comprising:
a bidirectional coupler having an input port, an output port, a forward coupled port, and a reverse coupled port, where the input port is configured to receive an input signal from a signal source coupled to the input port, and the output port is configured to provide a first output signal to a load coupled to the output port;

at least one analog to digital converter circuit having at least one input coupled to the forward coupled port and the reverse coupled port, and at least one output; and a processing circuitry having at least one input coupled to the at least one output of the at least one analog to digital converter circuit, and an output configured to generate a second output signal related to a level of at least one of a coupled reverse signal and an output reflected signal;

wherein the processing circuitry is configured to:
measure an amplitude and a phase of a coupled forward signal at a forward coupled port of a bidirectional coupler;
measure an amplitude and a phase of a coupled reverse signal at a reverse coupled port of the bidirectional coupler; and
determine an amplitude and a phase of an output reflected signal at the output port as a function:
the amplitude and the phase of the coupled forward signal coupled into the forward coupled port; and
the amplitude and the phase of the coupled reverse signal coupled into the reverse coupled port.

10. The system of claim 9, where the processing circuitry is further configured to determine the amplitude and phase of the output reflected signal at the output port with S-parameters according to:

$$\frac{b_4 - \left(\frac{b_3}{S_{31}} * S_{41}\right)}{S_{42}};$$

where $b_3$ is the coupled forward signal coupled into the forward coupled port;
where $b_4$ is the coupled reverse signal coupled into the reverse coupled port;
where $S_{31}$ is a transmission S-parameter from the input port of the bidirectional coupler to the forward coupled port;
where $S_{41}$ is a transmission S-parameter from the input port to the reverse coupled port; and
where $S_{42}$ is a transmission S-parameter from the output port of the bidirectional coupler to the reverse coupled port.

11. The system of claim 9, wherein the processing circuitry is further configured to:
determine if at least one of the output reflected power exceeds a reflected power threshold and a coupled reverse power exceeds a coupled reverse power threshold; and
if at least one of the output reflected power exceeds the reflected power threshold and the coupled reverse power exceeds the coupled reverse power threshold, perform at least one of: reduce a power level of the input signal at the input port of the bidirectional coupler until at least one of the output reflected power is less than or equal to the reflected power threshold and the coupled reverse power is less than or equal to the coupled reverse power threshold, and provide an alarm indicating that at least one of: the output reflected power exceeds a reflected power threshold and the coupled reverse power exceeds the coupled reverse power threshold.

12. The system of claim 11, further comprising:
a power control system coupled to the processing circuitry; and
wherein the signal source is a power amplifier coupled to the power control system and the input port;
wherein reducing the power level comprises reducing an output power level of the power amplifier.

13. The system of claim 9, wherein the processing circuitry is further configured to:
determine at least one of a reflection coefficient ($\Gamma$) at the output port and a voltage standing wave ratio (VSWR) at the output port, where the reflection coefficient and the voltage standing wave ratio are determined for the load coupled to the output port, and where:
the reflection coefficient is a function of the output reflected signal; and $$VSWR = \frac{1 + |r|}{1 - |r|}.$$

14. The system of claim 13, wherein the processing circuitry is further configured to:
determine if at least one of the reflection coefficient exceeds a reflection coefficient threshold and the VSWR exceeds a VSWR threshold; and
if at least one of the reflection coefficient exceeds the reflection coefficient threshold and the VSWR exceeds the VSWR threshold, then provide an alarm indicating that at least one of: the reflection coefficient exceeds the reflection coefficient threshold and the VSWR exceeds the VSWR threshold.

15. The system of claim 14, wherein the processing circuitry is further configured to:
determine if at least one of an input power at the input port is equal to or exceeds an input power threshold, and a coupled forward power is equal to or exceeds a coupled forward power threshold; and
if at least one of the input power is equal to or exceeds the input power threshold and the coupled forward power is equal to or exceeds the coupled forward power threshold, perform at least one of: reduce a power level of the input power until at least one of the input power at the input port less than an input power threshold and the coupled forward power is less than the coupled forward power threshold, and provide an alarm indicating an automatic limiting control function has been enabled.

16. The system of claim 15, further comprising:
a power control system;
wherein the signal source is a power control system coupled to the processing circuitry; and
wherein a power amplifier coupled to the power control system and the input port;
wherein reducing the power level comprises reducing an output power level of the power amplifier.

17. The system of claim 9, wherein the processing circuitry is further configured to:
determine if an input power is equal to or exceeds an input power threshold; and
if the input power is equal to or exceeds the input power threshold, perform at least one of reduce a power level of the input power until the input power is less than or equal to the input power threshold and provide an alarm indicating an automatic limiting control function has been enabled.

18. The system of claim 17, further comprising:
a power control system;
wherein the signal source is a power control system coupled to the processing circuitry; and
wherein a power amplifier coupled to the power control system and the input port;
wherein reducing the power level comprises reducing an output power level of the power amplifier.

19. The system of claim 9, wherein system comprises one of a remote antenna unit of a distributed antenna system and a single-node repeater.

20. A program product comprising a non-transitory processor readable medium on which program instructions are embodied, wherein the program instructions are configured, when executed by at least one programmable processor, to cause the at least one programmable processor to:
obtain a measurement of an amplitude and a phase of a coupled forward signal at a forward coupled port of a bidirectional coupler;
obtain a measurement of an amplitude and a phase of a coupled reverse signal at a reverse coupled port of the bidirectional coupler; and
determine an amplitude and a phase of an output reflected signal at an output port of the bidirectional coupler as a function of:
the amplitude and the phase of the coupled forward signal coupled into the forward coupled port; and
the amplitude and the phase of the coupled reverse signal coupled into the reverse coupled port.

21. The program product of claim 20, wherein the program instructions are configured, when executed by at least one programmable processor, to further cause the at least one programmable processor to determine an amplitude and phase of the output reflected signal at the output port with S-parameters according to:

$$\frac{b_4 - \left(\frac{b_3}{S_{31}} * S_{41}\right)}{S_{42}};$$

where $b_3$ is the coupled forward signal coupled into the forward coupled port;
where $b_4$ is the coupled reverse signal coupled into the reverse coupled port;
where $S_{31}$ is a transmission S-parameter from an input port of the bidirectional coupler to the forward coupled port;
where $S_{41}$ is a transmission S-parameter from the input port to the reverse coupled port; and
where $S_{42}$ is a transmission S-parameter from the output port of the bidirectional coupler to the reverse coupled port.

22. The program product of claim 20, wherein the program instructions are configured, when executed by at least one programmable processor, to further cause the at least one programmable processor to:
determine if at least one of an output reflected power exceeds a reflected power threshold and a coupled reverse power exceeds a coupled reverse power threshold; and
if at least one of the output reflected power exceeds the reflected power threshold and the coupled reverse power exceeds the coupled reverse power threshold, perform at least one of: reducing a power level of an input signal at an input port of the bidirectional coupler until at least one of the output reflected power is less than or equal to the reflected power threshold and the coupled reverse power is less than or equal to the coupled reverse power threshold, and providing an alarm indicating that at least one of the output reflected power exceeds a reflected power threshold and the coupled reverse power exceeds the coupled reverse power threshold.

23. The program product of claim 22, wherein reducing the power level of the input signal comprises reducing a power level of an output signal of a signal source that is a power amplifier having an output coupled to the input port.

24. The program product of claim 20, wherein the program instructions are configured, when executed by at least one programmable processor, to further cause the at least one programmable processor to:
determine at least one of a reflection coefficient ($\Gamma$) at the output port and a voltage standing wave ratio (VSWR) at the output port, where the reflection coefficient and the voltage standing wave ratio are determined for a load coupled to the output port, and where:
the reflection coefficient is a function of the output reflected signal; and $$VSWR = \frac{1+|r|}{1-|r|}.$$

25. The program product of claim 24, wherein the program instructions are configured, when executed by at least one programmable processor, to further cause the at least one programmable processor to:
determine if at least one of the reflection coefficient exceeds a reflection coefficient threshold and the VSWR exceeds a VSWR threshold; and
if at least one of the reflection coefficient exceeds the reflection coefficient threshold and the VSWR exceeds the VSWR threshold, then provide an alarm indicating that at least one of: the reflection coefficient exceeds the reflection coefficient threshold and the VSWR exceeds the VSWR threshold.

26. The program product of claim 20, wherein the program instructions are configured, when executed by at least one programmable processor, to further cause the at least one programmable processor to:
determine if at least one of an input power at an input port of the bidirectional coupler is equal to or exceeds an input power threshold, and a coupled forward power is equal to or exceeds a coupled forward power threshold; and
if at least one of the input power is equal to or exceeds the input power threshold and the coupled forward power is equal to or exceeds the coupled forward power, perform at least one of: reducing a power level of an input signal of the bidirectional coupler until at least one of the input power at the input port less than an input power threshold and the coupled forward power is less than the coupled forward power threshold, and providing an alarm indicating an automatic limiting control function has been enabled.

27. The program product of claim 26, wherein reducing the power level of the input signal comprises reducing a power level of an output signal of a signal source that is a power amplifier having an output coupled to the input port.

\* \* \* \* \*